US009865719B2

(12) United States Patent
Keller et al.

(10) Patent No.: US 9,865,719 B2
(45) Date of Patent: Jan. 9, 2018

(54) CARBON DOPING SEMICONDUCTOR DEVICES

(71) Applicant: Transphorm Inc., Goleta, CA (US)

(72) Inventors: Stacia Keller, Santa Barbara, CA (US); Brian L. Swenson, Santa Barbara, CA (US); Nicholas Fichtenbaum, Newbury Park, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/991,188

(22) Filed: Jan. 8, 2016

(65) Prior Publication Data

US 2016/0126342 A1 May 5, 2016

Related U.S. Application Data

(62) Division of application No. 14/208,482, filed on Mar. 13, 2014, now Pat. No. 9,245,993.

(Continued)

(51) Int. Cl.
*H01L 29/778* (2006.01)
*H01L 21/02* (2006.01)

(Continued)

(52) U.S. Cl.
CPC ...... *H01L 29/7784* (2013.01); *H01L 21/0237* (2013.01); *H01L 21/0254* (2013.01);

(Continued)

(58) Field of Classification Search
None
See application file for complete search history.

(56) References Cited

U.S. PATENT DOCUMENTS 4,300,091 A 11/1981 Schade, Jr.
4,645,562 A 2/1987 Liao et al.

(Continued)

FOREIGN PATENT DOCUMENTS

CN 1748320 3/2006
CN 101107713 1/2008

(Continued)

OTHER PUBLICATIONS

Authorized officer Chung Keun Lee, International Search Report and Written Opinion in PCT/US2008/076030, dated Mar. 23, 2009, 10 pages.

(Continued)

*Primary Examiner* — Jack Chen
(74) *Attorney, Agent, or Firm* — Fish & Richardson P.C.

(57) ABSTRACT

A method of fabricating a semiconductor device can include forming a III-N semiconductor layer in a reactor and injecting a hydrocarbon precursor into the reactor, thereby carbon doping the III-N semiconductor layer and causing the III-N semiconductor layer to be insulating or semi-insulating. A semiconductor device can include a substrate and a carbon doped insulating or semi-insulating III-N semiconductor layer on the substrate. The carbon doping density in the III-N semiconductor layer is greater than $5\times10^{18}$ $cm^{-3}$ and the dislocation density in the III-N semiconductor layer is less than $2\times10^{9}$ $cm^{-2}$.

6 Claims, 4 Drawing Sheets

118
114
Barrier Layer 110
116
Channel Layer 108
112
Buffer Layer 106
Nucleation Layer 104
Substrate 102

Related U.S. Application Data

(60) Provisional application No. 61/791,395, filed on Mar. 15, 2013.

(51) Int. Cl.
*H01L 29/20* (2006.01)
*H01L 29/66* (2006.01)
*H01L 29/207* (2006.01)
*H01L 29/205* (2006.01)
*H01L 29/32* (2006.01)
*H01L 29/872* (2006.01)
*H01L 29/10* (2006.01)

(52) U.S. Cl.
CPC .... *H01L 21/0262* (2013.01); *H01L 21/02381* (2013.01); *H01L 21/02458* (2013.01); *H01L 21/02579* (2013.01); *H01L 21/02584* (2013.01); *H01L 29/1029* (2013.01); *H01L 29/2003* (2013.01); *H01L 29/205* (2013.01); *H01L 29/207* (2013.01); *H01L 29/32* (2013.01); *H01L 29/66462* (2013.01); *H01L 29/7786* (2013.01); *H01L 29/7787* (2013.01); *H01L 29/872* (2013.01)

(56) References Cited

U.S. PATENT DOCUMENTS 4,728,826 A 3/1988 Einzinger et al.
4,821,093 A 4/1989 Iafrate et al.
4,914,489 A 4/1990 Awano
5,051,618 A 9/1991 Lou
5,173,445 A 12/1992 Ando et al.
5,329,147 A 7/1994 Vo et al.
5,618,384 A 4/1997 Chan et al.
5,646,069 A 7/1997 Jelloian et al.
5,663,091 A 9/1997 Yen et al.
5,705,847 A 1/1998 Kashiwa et al.
5,714,393 A 2/1998 Wild et al.
5,909,103 A 6/1999 Williams
5,998,810 A 12/1999 Hatano et al.
6,008,684 A 12/1999 Ker et al.
6,097,046 A 8/2000 Plumton
6,100,571 A 8/2000 Mizuta et al.
6,292,500 B1 9/2001 Kouchi et al.
6,307,220 B1 10/2001 Yamazaki
6,316,793 B1 11/2001 Sheppard et al.
6,373,082 B1 4/2002 Ohno et al.
6,429,468 B1 8/2002 Hsu et al.
6,475,889 B1 11/2002 Ring
6,486,502 B1 11/2002 Sheppard et al.
6,504,235 B2 1/2003 Schmitz et al.
6,515,303 B2 2/2003 Ring
6,544,867 B1 4/2003 Webb et al.
6,548,333 B2 4/2003 Smith
6,552,373 B2 4/2003 Ando et al.
6,580,101 B2 6/2003 Yoshida
6,583,454 B2 6/2003 Sheppard et al.
6,586,781 B2 7/2003 Wu et al.
6,624,452 B2 9/2003 Yu et al.
6,649,497 B2 11/2003 Ring
6,727,531 B1 4/2004 Redwing et al.
6,746,938 B2 6/2004 Uchiyama et al.
6,777,278 B2 8/2004 Smith
6,849,882 B2 2/2005 Chavarkar et al.
6,867,078 B1 3/2005 Green et al.
6,946,739 B2 9/2005 Ring
6,979,863 B2 12/2005 Ryu
6,982,204 B2 1/2006 Saxler et al.
7,030,428 B2 4/2006 Saxler
7,045,404 B2 5/2006 Sheppard et al.
7,071,498 B2 7/2006 Johnson et al.
7,078,743 B2 7/2006 Murata et al.
7,084,475 B2 8/2006 Shelton et al.
7,109,552 B2 9/2006 Wu
7,125,786 B2 10/2006 Ring et al.
7,126,212 B2 10/2006 Enquist et al.
7,161,194 B2 1/2007 Parikh et al.
7,169,634 B2 1/2007 Zhao et al.
7,170,111 B2 1/2007 Saxler
7,217,960 B2 5/2007 Ueno et al.
7,230,284 B2 6/2007 Parikh et al.
7,238,560 B2 7/2007 Sheppard et al.
7,250,641 B2 7/2007 Saito et al.
7,253,454 B2 8/2007 Saxler
7,265,399 B2 9/2007 Sriram et al.
7,268,375 B2 9/2007 Shur et al.
7,304,331 B2 12/2007 Saito et al.
7,321,132 B2 1/2008 Robinson et al.
7,326,971 B2 2/2008 Harris et al.
7,332,795 B2 2/2008 Smith et al.
7,364,988 B2 4/2008 Harris et al.
7,375,407 B2 5/2008 Yanagihara et al.
7,388,236 B2 6/2008 Wu et al.
7,419,892 B2 9/2008 Sheppard et al.
7,429,534 B2 9/2008 Gaska et al.
7,432,142 B2 10/2008 Saxler et al.
7,436,001 B2 10/2008 Lee et al.
7,449,730 B2 11/2008 Kuraguchi
7,456,443 B2 11/2008 Saxler et al.
7,465,967 B2 12/2008 Smith et al.
7,488,992 B2 2/2009 Robinson
7,501,669 B2 3/2009 Parikh et al.
7,501,670 B2 3/2009 Murphy
7,508,014 B2 3/2009 Tanimoto
7,544,963 B2 6/2009 Saxler
7,547,925 B2 6/2009 Wong et al.
7,550,783 B2 6/2009 Wu et al.
7,550,784 B2 6/2009 Saxler et al.
7,566,918 B2 7/2009 Wu et al.
7,573,078 B2 8/2009 Wu et al.
7,592,211 B2 9/2009 Sheppard et al.
7,598,108 B2 10/2009 Li et al.
7,601,993 B2 10/2009 Hoshi et al.
7,605,017 B2 10/2009 Hayashi et al.
7,612,390 B2 11/2009 Saxler et al.
7,615,774 B2 11/2009 Saxler
7,629,627 B2 12/2009 Mil'shtein et al.
7,638,818 B2 12/2009 Wu et al.
7,655,962 B2 2/2010 Simin et al.
7,678,628 B2 3/2010 Sheppard et al.
7,692,263 B2 4/2010 Wu et al.
7,700,973 B2 4/2010 Shen et al.
7,709,269 B2 5/2010 Smith et al.
7,709,859 B2 5/2010 Smith et al.
7,714,360 B2 5/2010 Otsuka et al.
7,723,739 B2 5/2010 Takano et al.
7,728,356 B2 6/2010 Suh et al.
7,745,851 B2 6/2010 Harris
7,755,108 B2 7/2010 Kuraguchi
7,759,699 B2 7/2010 Beach
7,759,700 B2 7/2010 Ueno et al.
7,777,252 B2 8/2010 Sugimoto et al.
7,777,254 B2 8/2010 Sato
7,795,622 B2 9/2010 Kikkawa et al.
7,795,642 B2 9/2010 Suh et al.
7,812,369 B2 10/2010 Chini et al.
7,834,380 B2 11/2010 Ueda et al.
7,851,825 B2 12/2010 Suh et al.
7,855,401 B2 12/2010 Sheppard et al.
7,859,014 B2 12/2010 Nakayama et al.
7,859,021 B2 12/2010 Kaneko
7,875,537 B2 1/2011 Suvorov et al.
7,875,907 B2 1/2011 Honea et al.
7,875,910 B2 1/2011 Sheppard et al.
7,875,914 B2 1/2011 Sheppard
7,884,394 B2 2/2011 Wu et al.
7,884,395 B2 2/2011 Saito
7,892,974 B2 2/2011 Ring et al.
7,893,500 B2 2/2011 Wu et al.
7,898,004 B2 3/2011 Wu et al.
7,901,994 B2 3/2011 Saxler et al.
7,906,799 B2 3/2011 Sheppard et al.
7,915,643 B2 3/2011 Suh et al.

(56) References Cited

U.S. PATENT DOCUMENTS

| | | | |
|---|---|---|---|
| 7,915,644 | B2 | 3/2011 | Wu et al. |
| 7,919,791 | B2 | 4/2011 | Flynn et al. |
| 7,928,475 | B2 | 4/2011 | Parikh et al. |
| 7,932,539 | B2 | 4/2011 | Chen et al. |
| 7,935,985 | B2 | 5/2011 | Mishra et al. |
| 7,948,011 | B2 | 5/2011 | Rajan et al. |
| 7,955,918 | B2 | 6/2011 | Wu et al. |
| 7,955,984 | B2 | 6/2011 | Ohki |
| 7,960,756 | B2 | 6/2011 | Sheppard et al. |
| 7,982,242 | B2 | 7/2011 | Goto |
| 7,985,986 | B2 | 7/2011 | Heikman et al. |
| 7,985,987 | B2 | 7/2011 | Kaneko |
| 8,049,252 | B2 | 11/2011 | Smith et al. |
| 8,076,698 | B2 | 12/2011 | Ueda et al. |
| 8,076,699 | B2 | 12/2011 | Chen et al. |
| 8,110,425 | B2 | 2/2012 | Yun |
| 8,153,515 | B2 | 4/2012 | Saxler |
| 8,174,048 | B2 | 5/2012 | Beach |
| 8,178,900 | B2 | 5/2012 | Kurachi et al. |
| 8,223,458 | B2 | 7/2012 | Mochizuki et al. |
| 8,237,198 | B2 | 8/2012 | Wu et al. |
| 8,264,003 | B2 | 9/2012 | Herman |
| 8,361,816 | B2 | 1/2013 | Lee et al. |
| 8,389,975 | B2 | 3/2013 | Kikuchi et al. |
| 8,390,000 | B2 | 3/2013 | Chu et al. |
| 8,404,042 | B2 | 3/2013 | Mizuhara et al. |
| 8,431,960 | B2 | 4/2013 | Beach et al. |
| 8,455,885 | B2 | 6/2013 | Keller et al. |
| 8,471,267 | B2 | 6/2013 | Hayashi et al. |
| 8,476,125 | B2 | 7/2013 | Khan et al. |
| 8,492,779 | B2 | 7/2013 | Lee |
| 8,502,323 | B2 | 8/2013 | Chen |
| 8,519,438 | B2 | 8/2013 | Mishra et al. |
| 8,525,231 | B2 | 9/2013 | Park et al. |
| 8,603,880 | B2 | 12/2013 | Yamada |
| 8,614,460 | B2 | 12/2013 | Matsushita |
| 8,652,948 | B2 | 2/2014 | Horie et al. |
| 8,674,407 | B2 | 3/2014 | Ando et al. |
| 8,698,198 | B2 | 4/2014 | Kuraguchi |
| 8,716,141 | B2 | 5/2014 | Dora et al. |
| 8,772,832 | B2 | 7/2014 | Boutros |
| 9,245,992 | B2 | 1/2016 | Keller et al. |
| 9,245,993 | B2 | 1/2016 | Keller et al. |
| 2003/0006437 | A1 | 1/2003 | Mizuta et al. |
| 2004/0041169 | A1 | 3/2004 | Ren et al. |
| 2004/0119067 | A1 | 6/2004 | Weeks, Jr. et al. |
| 2004/0155250 | A1 | 8/2004 | Ohba |
| 2005/0133816 | A1 | 6/2005 | Fan et al. |
| 2005/0189561 | A1 | 9/2005 | Kinzer et al. |
| 2005/0189562 | A1 | 9/2005 | Kinzer et al. |
| 2006/0043499 | A1 | 3/2006 | De Cremoux et al. |
| 2006/0060871 | A1 | 3/2006 | Beach |
| 2006/0076677 | A1 | 4/2006 | Daubenspeck et al. |
| 2006/0102929 | A1 | 5/2006 | Okamoto et al. |
| 2006/0145189 | A1 | 7/2006 | Beach |
| 2006/0189109 | A1 | 8/2006 | Fitzgerald |
| 2006/0202272 | A1 | 9/2006 | Wu et al. |
| 2006/0226442 | A1 | 10/2006 | Zhang et al. |
| 2007/0018199 | A1 | 1/2007 | Sheppard et al. |
| 2007/0018210 | A1 | 1/2007 | Sheppard |
| 2007/0045670 | A1 | 3/2007 | Kuraguchi |
| 2007/0080672 | A1 | 4/2007 | Yang |
| 2007/0128743 | A1 | 6/2007 | Huang et al. |
| 2007/0131968 | A1 | 6/2007 | Morita et al. |
| 2007/0145417 | A1 | 6/2007 | Brar et al. |
| 2007/0205433 | A1 | 9/2007 | Parikh et al. |
| 2007/0210329 | A1 | 9/2007 | Goto |
| 2007/0224710 | A1 | 9/2007 | Palacios et al. |
| 2007/0228477 | A1 | 10/2007 | Suzuki et al. |
| 2007/0249119 | A1 | 10/2007 | Saito |
| 2007/0295985 | A1 | 12/2007 | Weeks, Jr. et al. |
| 2008/0054247 | A1 | 3/2008 | Eichler et al. |
| 2008/0073670 | A1 | 3/2008 | Yang et al. |
| 2008/0093621 | A1 | 4/2008 | Takeda et al. |
| 2008/0135829 | A1 | 6/2008 | Lee |
| 2008/0283844 | A1 | 11/2008 | Hoshi et al. |
| 2008/0308813 | A1 | 12/2008 | Suh et al. |
| 2009/0045438 | A1 | 2/2009 | Inoue et al. |
| 2009/0050936 | A1 | 2/2009 | Oka |
| 2009/0072269 | A1 | 3/2009 | Suh et al. |
| 2009/0075455 | A1 | 3/2009 | Mishra |
| 2009/0085065 | A1 | 4/2009 | Mishra et al. |
| 2009/0140262 | A1 | 6/2009 | Ohki et al. |
| 2009/0201072 | A1 | 8/2009 | Honea et al. |
| 2009/0278144 | A1 | 11/2009 | Sonobe et al. |
| 2010/0065923 | A1 | 3/2010 | Charles et al. |
| 2010/0067275 | A1 | 3/2010 | Wang et al. |
| 2010/0133506 | A1 | 6/2010 | Nakanishi et al. |
| 2010/0203234 | A1 | 8/2010 | Anderson et al. |
| 2010/0219445 | A1 | 9/2010 | Yokoyama et al. |
| 2010/0244101 | A1 | 9/2010 | Kokawa et al. |
| 2011/0012110 | A1 | 1/2011 | Sazawa et al. |
| 2011/0062556 | A1 | 3/2011 | Komiyama et al. |
| 2012/0217512 | A1 | 8/2012 | Renaud |
| 2012/0267637 | A1 | 10/2012 | Jeon et al. |
| 2012/0299060 | A1* | 11/2012 | Kohda .............. H01L 21/02381 257/190 |
| 2013/0020581 | A1 | 1/2013 | Teraguchi et al. |
| 2013/0056744 | A1 | 3/2013 | Mishra et al. |
| 2013/0328061 | A1 | 12/2013 | Chu et al. |
| 2014/0084346 | A1 | 3/2014 | Tajiri |
| 2014/0264370 | A1 | 9/2014 | Keller et al. |
| 2014/0264455 | A1 | 9/2014 | Keller et al. |
| 2016/0133737 | A1 | 5/2016 | Keller et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 11-224950 | 8/1999 |
| JP | 2000-058871 | 2/2000 |
| JP | 2000-068498 | 3/2000 |
| JP | 2001-135813 | 5/2001 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-525023 | 7/2010 |
| JP | 2010-171416 | 8/2010 |
| JP | 2010-539712 | 12/2010 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |

(56) References Cited

FOREIGN PATENT DOCUMENTS

| | | |
|---|---|---|
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, dated Mar. 25, 2010, 5 pages.
Authorized officer Chung Keun Lee, International Search Report and Written Opinion in PCT/US2008/076079, dated Mar. 20, 2009, 11 pages.
Authorized officer Nora Lindner, International Preliminary Report on Patentability in PCT/US2008/076079, dated Apr. 1, 2010, 6 pages.
Authorized officer Keon Hyeong Kim, International Search Report and Written Opinion in PCT/US2008/076160 dated Mar. 18, 2009, 11 pages.
Authorized officer Simin Baharlou, International Preliminary Report on Patentability in PCT/US2008/076160, dated Mar. 25, 2010, 6 pages.
Authorized officer Chung Keun Lee, International Search Report and Written Opinion in PCT/US2008/076199, dated Mar. 24, 2009, 11 pages.
Authorized officer Dorothee Miilhausen, International Preliminary Report on Patentability in PCT/US2008/076199, dated Apr. 1, 2010, 6 pages.
Authorized officer Keon Hyeong Kim, International Search Report and Written Opinion in PCT/US2008/085031, dated Jun. 24, 2009, 11 pages.
Authorized officer Yolaine Cussac, International Preliminary Report on Patentability in PCT/US2008/085031, dated Jun. 24, 2010, 6 pages.
Authorized officer Tae Hoon Kim, International Search Report and Written Opinion in PCT/US2009/041304, dated Dec. 18, 2009, 13 pages.
Authorized officer Dorothee Miilhausen, International Preliminary Report on Patentability, in PCT/US2009/041304, dated Nov. 4, 2010, 8 pages.
Authorized officer Sung Hee Kim, International Search Report and the Written Opinion in PCT/US2009/057554, dated May 10, 2010, 13 pages.
Authorized Officer Gijsbertus Beijer, International Preliminary Report on Patentability in PCT/US2009/057554, dated Mar. 29, 2011, 7 pages.
Authorized officer Cheon Whan Cho, International Search Report and Written Opinion in PCT/US2009/066647, dated Jul. 1, 2010, 16 pages.
Authorized officer Athina Nikitas-Etienne, International Preliminary Report on Patentability in PCT/US2009/066647, dated Jun. 23, 2011, 12 pages.
Authorized officer Sung Chan Chung, International Search Report and Written Opinion for PCT/US2010/021824, dated Aug. 23, 2010, 9 pages.
Authorized officer Beate Giffo-Schmitt, International Preliminary Report on Patentability in PCT/US2010/021824, dated Aug. 18, 2011, 6 pages.
Authorized officer Sang Ho Lee, International Search Report and Written Opinion in PCT/US2010/034579, dated Dec. 24, 2010, 9 pages.
Authorized officer Nora Lindner, International Preliminary Report on Patentability in PCT/US2010/034579, dated Nov. 24, 2011, 7 pages.
Authorized officer Jeongmin Choi, International Search Report and Written Opinion in PCT/US2010/046193, dated Apr. 26, 2011, 13 pages.
Authorized officer Philippe Bécamel, International Preliminary Report on Patentability in PCT/US2010/046193, dated Mar. 8, 2012, 10 pages.
Authorized officer Sang Ho Lee, International Search Report and Written Opinion in PCT/US2010/059486, dated Jul. 26, 2011, 9 pages.
Authorized officer Nora Lindner, International Preliminary Report on Patentability in PCT/US2010/059486, dated Jun. 21, 2012, 6 pages.
Authorized officer Kwan Sik Sul, International Search Report and Written Opinion in PCT/US2011/063975, dated May 18, 2012, 8 pages.
Authorized officer Simin Baharlou, International Preliminary Report on Patentability in PCT/US2011/063975, dated Jun. 27, 2013, 5 pages.
Authorized officer Sang-Taek Kim, International Search Report and Written Opinion in PCT/US2011/061407, dated May 22, 2012, 10 pages.
Authorized officer Lingfei Bai, International Preliminary Report on Patentability in PCT/US2011/061407, dated Jun. 6, 2013, 7 pages.
Authorized officer Kwan Sik Sul, International Search Report and Written Opinion in PCT/US2012/023160, dated May 24, 2012, 9 pages.
Authorized officer Simin Baharlou, International Preliminary Report on Patentability in PCT/US2012/023160, dated Aug. 15, 2013, 6 pages.
Authorized officer Jeongmin Choi, International Search Report and Written Opinion in PCT/US2012/027146, dated Sep. 24, 2012, 12 pages.
Authorized officer Athina Nickitas-Etienne, International Preliminary Report on Patentability in PCT/US2012/027146, dated Sep. 19, 2013, 9 pages.
Authorized officer Tae Hoon Kim, International Search Report and Written Opinion in PCT/US2013/035837, dated Jul. 30, 2013, 9 pages.
Authorized officer Agnes Wittmann-Regis, International Preliminary Report on Patentability in PCT/US2013/035837, dated Oct. 23, 2014, 6 pages.
Authorized officer Hye Lyun Park, International Search Report and Written Opinion in PCT/US2013/050914, dated Oct. 18, 2013, 11 pages.
Authorized officer Yukari Nakamura, International Preliminary Report on Patentability in PCT/US2013/050914, dated Jan. 29, 2015, 8 pages.
Authorized officer Sang Won Choi, International Search Report and Written Opinion in PCT/US2013/024470, dated May 27, 2013, 12 pages.
Authorized officer Simin Baharlou, International Preliminary Report on Patentability in PCT/US2013/024470, dated Aug. 14, 2014, 9 pages.
Authorized officer June Young Son, International Search Report and Written Opinion in PCT/US2014/016298, dated May 23, 2014, 15 pages.
Authorized officer Tae Hoon Kim, International Search Report and Written Opinion in PCT/US2014/027523, dated Jul. 30, 2014, 14 pages.
Authorized officer June Young Son, International Search Report and Written Opinion in PCT/US2014/024191, dated Aug. 7, 2014, 11 pages.
European Search Report in Application No. 10 81 5813.0, dated Mar. 12, 2013, 9 pages.
Search Report and Action in TW Application No. 098132132, dated Dec. 6, 2012, 8 pages.
Chinese First Office Action for Application No. 200880120050.6, dated Aug. 2, 2011, 10 pages.
Chinese First Office Action for Application No. 200980114639.X, dated May 14, 2012, 13 pages.
Ando et al., "10-W/mm A1GaN-GaN HFET with a Field Modulating Plate," IEEE Electron Device Letters, 2003, 24(5):289-291.
Arulkumaran et al., "Enhancement of Breakdown Voltage by A1N Buffer Layer Thickness in A1GaN/GaN High-electron-mobility Transistors on 4 in. Diameter Silicon," Applied Physics Letters, 2005, 86:123503-1-3.

(56) References Cited

OTHER PUBLICATIONS

Arulkumaran et al. "Surface Passivation Effects on A1GaN/GaN High-Electron-Mobility Transistors with $SiO_2$, $Si_3N_4$, and Silicon Oxynitride," Applied Physics Letters, 2004, 84(4):613-615.
Bahat-Treidel et al., "A1GaN/GaN/GaN:C Back-barrier HFETs with Breakdown Voltage of Over 1 kV and Low RON X A," IEEE Transactions on Electron Devices, 2010, 57(11):3050-3058.
Barnett and Shinn, "Plastic and Elastic Properties of Compositionally Modulated Thin Films," Annu. Rev. Mater. Sci., 1994, 24:481-511.
Chen et al., "High-performance A1GaN/GaN Lateral Field-effect Rectifiers Compatible with High Electron Mobility Transistors," Applied Physics Letters, 2008, 92, 253501-1-3.
Cheng et al., "Flat GaN Epitaxial Layers Grown on Si(111) by Metalorganic Vapor Phase Epitaxy Using Step-graded A1GaN Intermediate Layers," Journal of Electronic Materials, 2006, 35(4):592-598.
Coffie, "Characterizing and Suppressing DC-to-RF Dispersion in A1GaN/GaN High Electron Mobility Transistors," 2003, PhD Thesis, University of California, Santa Barbara, 169 pages.
Coffie et al., "Unpassivated p-GaN/A1GaN/GaN HEMTs with 7.1 W/mm at 10 GhZ," Electronic Letters, 2003, 39(19):1419-1420.
Chu et al., "1200-V Normally Off GaN-on-Si Field-effect Transistors with Low Dynamic On-Resistance," IEEE Electron Device Letters, 2011, 32(5):632-634.
Dora et al., "High Breakdown Voltage Achieved on A1GaN/GaN HEMTs with Integrated Slant Field Plates," IEEE Electron Device Letters, 2006, 27(9):713-715.
Dora et al., "$ZrO_2$ Gate Dielectrics Produced by Ultraviolet Ozone Oxidation for GaN and A1GaN/GaN Transistors," J. Vac. Sci. Technol. B, 2006, 24(2)575-581.
Dora, "Understanding Material and Process Limits for High Breakdown Voltage A1GaN/GaN HEMTs," PhD Thesis, University of California, Santa Barbara, Mar. 2006, 157 pages.
Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.
Green et al., "The Effect of Surface Passivation on the Microwave Characteristics of Undoped A1GaN/GaN HEMT's," IEEE Electron Device Letters, 2000, 21(6):268 270.
Gu et al., "A1GaN/GaN MOS Transistors using Crystalline $ZrO_2$ as Gate Dielectric," Proceedings of SPIE, 2007, vol. 6473, 64730S-1-8.
Higashiwaki et al. "A1GaN/GaN Heterostructure Field-Effect Transistors on 4H-SiC Substrates with Current-Gain Cutoff Frequency of 190 GHz," Applied Physics Express, 2008, 021103-1-3.
Hou et al., "Carbon Doping and Etching of A1XGa1-XAs ($0 \leq x \leq 1$) with Carbon Ttetrachloride in Metalorganic Vapor Phase Epitaxy," Appl. Phys. Lett., 1997, 70(26):3600-3602.
Hwang et al., "Effects of a Molecular Beam Epitaxy Grown AIN Passivation Layer on A1GaN/GaN Heterojunction Field Effect Transistors," Solid-State Electronics, 2004, 48:363-366.
Im et al., "Normally Off GaN MOSFET Based on A1GaN/GaN Heterostructure with Extremely High 2DEG Density Grown on Silicon Substrate," IEEE Electron Device Letters, 2010, 31(3):192-194.
Karmalkar and Mishra, "Enhancement of Breakdown Voltage in A1GaN/GaN High Electron Mobility Transistors Using a Field Plate," IEEE Transactions on Electron Devices, 2001, 48(8):1515-1521.
Karmalkar and Mishra, "Very High Voltage A1GaN/GaN High Electron Mobility Transistors Using a Field Plate Deposited on a Stepped Insulator," Solid-State Electronics, 2001, 45:1645-1652.
Kato et al., "C-doped GaN Buffer Layers with High Breakdown Voltages for High Power Operation A1GaN/GaN HFETs on 4-in Si Substrates by MOVPE," Journal of Crystal Growth, 2007, 298:831-834.
Kawanishi and Tomizawa, "Carbon-doped *p*-type (0001) Plane A1GaN (A1=6-55%) with High Hole Density," Phys. Status Solidi. B, 2012, 249(3):459-463.
Keller et al., "GaN-GaN Junctions with Ultrathin AIN Interlayers: Expanding Heterojunction Design," Applied Physics Letters, 2002, 80(23):4387-4389.
Keller et al., "Method for Heteroepitaxial Growth of High Quality N-Face GaN, InN and AIN and their Alloys by Metal Organic Chemical Vapor Deposition," U.S. Appl. No. 60/866,035, filed Nov. 15, 2006, 31 pages.
Khan et al., "A1GaN/GaN Metal Oxide Semiconductor Heterostructure Field Effect Transistor," IEEE Electron Device Letters, 2000, 21(2):63-65.
Kim, "Process Development and Device Characteristics of A1GaN/GaN HEMTs for High Frequency Applications," PhD Thesis, University of Illinois at Urbana-Champaign, 2007, 120 pages.
Kumar et al., "High Transconductance Enhancement-mode A1GaN/GaN HEMTs on SiC Substrate," Electronics Letters, 2003, 39(24):1758-1760.
Kuraguchi et al., "Normally-off GaN-MISFET with Well-controlled Threshold Voltage," Phys. Stats. Sol., 2007, 204(6):2010-2013.
Lanford et al., "Recessed-gate Enhancement-mode GaN HEMT with High Threshold Voltage, " Electronic Letters, 2005, 41(7):449-450.
Lee et al., "Self-aligned Process for Emitter- and Base-regrowth GaN HBTs and BJTs," Solid-State Electronics, 2001, 45:243-247.
Marchand et al., "Metalorganic Chemical Vapor Deposition on GaN on Si(111): Stress Control and Application to Filed-effect Transistors," Journal of Applied Physics, 2001, 89(12):7846-7851.
Mishra et al., "N-face High Electron Mobility Transistors with Low Buffer Leakage and Low Parasitic Resistance," U.S. Appl. No. 60/908,914, filed Mar. 29, 2007, 21 pages.
Mishra et al., "Polarization-induced Barriers for N-face Nitride-based Electronics," U.S. Appl. No. 60/940,052, filed May 24, 2007, 29 pages.
Mishra et al., "Growing N-polar III-nitride structures," U.S. Appl. No. 60/972,467, filed Sep. 14, 2007, 7 pages.
Mishra et al., "A1GaN/GaN HEMTs—An Overview of Device Operation and Applications," Proceedings of the IEEE, 2002, 90(6):1022-1031.
Nanjo et al., "Remarkable Breakdown Voltage Enhancement in A1GaN Channel High Electron Mobility Transistors," Applied Physics Letters 92 (2008), 3 pages.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Oka and Nozawa, "A1GaN/GaN Recessed MIS-gate HFET with High-threshold-voltage Normally-off Operation for Power Electronics Applications," IEEE Electron Device Letters, 2008, 29(7):668-670.
Palacios et al., "A1GaN/GaN HEMTs with an InGaN-based Back-barrier," Device Research Conference Digest, 2005, DRC '05 63rd, pp. 181-182.
Palacios et al., "A1GaN/GaN High Electron Mobility Transistors with InGaN Back-Barriers," IEEE Electron Device Letters, 2006, 27(1):13-15.
Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.
Palacios et al., "Nitride-based High Electron Mobility Transistors with a GaN Spacer," Applied Physics Letters, 2006, 89:073508-1-3.
Pei et al., "Effect of Dielectric Thickness on Power Performance of A1GaN/GaN HEMTs," IEEE Electron Device Letters, 2009, 30(4):313-315.
Tracy Frost, "Planar, Low Switching Loss, Gallium Nitride Devices for Power Conversion Applications," SBIR N121-090 (Navy), 2012, 3 pages.
Rajan et al., "Advanced Transistor Structures Based on N-face GaN," 32M International Symposium on Compound Semiconductors (ISCS), Sep. 18-22, 2005, Europa-Park Rust, Germany, 2 pages.
Reiher et al., "Efficient Stress Relief in GaN Heteroepitaxy on Si(111) Using Low-temperature AIN Interlayers," Journal of Crystal Growth, 2003, 248:563-567.

(56) References Cited

OTHER PUBLICATIONS

Saito et al., "Recessed-gate Structure Approach Toward Normally Off High-voltage A1GaN/GaN HEMT for Power Electronics Applications," IEEE Transactions on Electron Device, 2006, 53(2):356-362.
Shelton et al., "Selective Area Growth and Characterization of A1GaN/GaN Heterojunction Bipolar Transistors by Metalorganic Chemical Vapor Deposition," IEEE Transactions on Electron Devices, 2001, 48(3):490-494.
Shen, "Advanced Polarization-based Design of A1GaN/GaN HEMTs," Jun. 2004, PhD Thesis, University of California, Santa Barbara, 192 pages.
Sugiyama et al., "Design of A1GaN/GaN HFETs with High Breakdown Voltage with Carbon-doped GaN on Conductive GaN Substrate," presentation on Oct. 17, 2012, at the IWN2012 International Workshop on Nitride Semiconductors 2012, Sapporo, Japan, 2 pages.
Sugiura et al., "Enhancement-mode *n*-channel GaN MOSFETs Fabricated on p-GaN Using $HfO_2$ as Gate Oxide," Electronics Letters, 2007, vol. 43, No. 17, 2 pages.
Suh et al., "High Breakdown Enhancement Mode GaN-based HEMTs with Integrated Slant Field Plate," U.S. Appl. No. 60/822,886, filed Aug. 18, 2006, 16 pages.
Suh et al. "High-Breakdown Enhancement-mode A1GaN/GaN HEMTs with Integrated Slant Field-Plate," Electron Devices Meeting, 2006, IEDM '06 International, 3 pages.
Suh et al., "III-Nitride Devices with Recessed Gates," U.S. Appl. No. 60/972,481, filed Sep. 14, 2007, 18 pages.
Tipirneni et al. "Silicon Dioxide-encapsulated High-Voltage A1GaN/GaN HFETs for Power-Switching Applications," IEEE Electron Device Letters, 2007, 28(9):784-786.
Vetury et al., "Direct Measurement of Gate Depletion in High Breakdown (405V) A1/GaN/GaN Heterostructure Field Effect Transistors," IEDM 98, 1998, pp. 55-58.
Wang et al., "Comparison of the Effect of Gate Dielectric Layer on 2DEG Carrier Concentration in Strained A1GaN/GaN Heterostructure," Mater. Res. Soc. Symp. Proc., 2007, vol. 831, 6 pages.
Wang et al., "Enhancement-mode $Si_3N_4$/A1GaN/GaN MISHFETs," IEEE Electron Device Letters, 2006, 27(10):793-795.
Wu, "A1GaN/GaN Microwave Power High-Mobility Transistors," PhD Thesis, University of California, Santa Barbara, Jul. 1997, 134 pages.
Wu et al., "A 97.8% Efficient GaN HEMT Boost Converter with 300-W Output Power at 1 MHz," Electronic Device Letters, 2008, IEEE, 29(8):824-826.
Yoshida, "A1Gan/GaN Power FET," Furukawa Review, 2002, 21:7-11.
Zhang, "High Voltage GaN HEMTs with Low On-resistance for Switching Applications," PhD Thesis, University of California, Santa Barbara, Sep. 2002, 166 pages.
Zhang and Kuech, "Photoluminescence of Carbon In Situ Doped GaN Grown by Halide Vapor Phase Epitaxy," Applied Physics Letters, 1998, 72(13):1611-1613.
Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.
Authorized officer Kihwan Moon, International Preliminary Report on Patentability in PCT/US2014/016298, dated Aug. 27, 2015, 12 pages.
Authorized officer Nora Lindner, International Preliminary Report on Patentability in PCT/US2014/027523, dated Sep. 24, 2015, 11 pages.
Authorized officer Kihwan Moon, International Preliminary Report on Patentability in PCT/US2014/024191, dated Sep. 24, 2015, 8 pages.
European Search Report in Application No. EP 14 77 0712.9, dated Sep. 30, 2016, 5 pages.
Webb et al.,"Semi-insulating C-doped GaN and High-mobility A1GaN/GaN Heterostructures Grown by Ammonia Molecular Beam Epitaxy," Applied Physics Letters, Aug. 16, 1999, 75(7):953-955.

* cited by examiner

CARBON DOPING SEMICONDUCTOR DEVICES

CROSS-REFERENCE TO RELATED APPLICATIONS

This is a divisional of U.S. application Ser. No. 14/208,482, filed on Mar. 13, 2014, which claims priority to U.S. Provisional Application No. 61/791,395, filed on Mar. 15, 2013. The disclosure of the prior applications are considered part of and are incorporated by reference in the disclosure of this application.

TECHNICAL FIELD

This disclosure relates generally to fabricating semiconductor devices, and in particular to carbon doping semiconductor devices.

BACKGROUND

Many transistors used in power electronic applications have been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-Nitride or III-N semiconductor devices, such as gallium nitride (GaN) based devices, are now emerging as attractive candidates to carry large currents, support high voltages, and to provide very low on-resistance and fast switching times.

SUMMARY

In one aspect, a method of fabricating a semiconductor device can include forming a III-N material structure in a reactor and, while forming the III-N semiconductor layer, injecting a hydrocarbon precursor into the reactor, thereby carbon doping the III-N semiconductor layer and causing the III-N semiconductor layer to be insulating or semi-insulating.

In a second aspect, a semiconductor device can include a substrate and a carbon doped insulating or semi-insulating III-N semiconductor layer on the substrate. The carbon doping density in the III-N semiconductor layer is greater than $1\times10^{18}$, $5\times10^{18}$, or $1\times10^{19}$ $cm^{-3}$, and a dislocation density in the III-N semiconductor layer is less than $2\times10^{9}$ $cm^{-2}$.

In a third aspect, a method of forming a semiconductor material structure can include forming a first III-N semiconductor layer on a substrate in a reactor, and while forming the first III-N semiconductor layer, injecting a hydrocarbon precursor into the reactor, thereby carbon doping the first III-N semiconductor layer and causing the first III-N semiconductor layer to be insulating or semi-insulating. The method can further include forming a second III-N material layer on the first III-N semiconductor layer, wherein the second III-N material layer has a substantially lower carbon concentration than the first III-N material layer.

In a fourth aspect, a material structure can include a first III-N semiconductor layer on a foreign substrate, and a second III-N semiconductor layer on a side of the first III-N material structure opposite the foreign substrate, the second III-N semiconductor layer being thinner than the first III-N semiconductor layer. The first III-N semiconductor layer can have a carbon concentration greater than $1\times10^{18}$ $cm^{-3}$ throughout the layer, and a carbon concentration throughout the second III-N semiconductor layer can be less than the carbon concentration throughout the first III-N semiconductor layer. Furthermore, a surface of the second III-N material layer that is opposite the substrate can have a density of macroscopic features which is less than 5 features/$cm^2$, wherein each of the macroscopic features has an average height of greater than 100 nanometers.

In a fifth aspect, a material structure can include a first III-N semiconductor layer on a foreign substrate, and a second III-N semiconductor layer on a side of the first III-N material structure opposite the foreign substrate, the second III-N semiconductor layer being thinner than the first III-N semiconductor layer. The first III-N semiconductor layer can be an insulating or semi-insulating layer having a carbon concentration greater than $1\times10^{18}$ $cm^{-3}$. A carbon concentration of the second III-N semiconductor layer can be less than the carbon concentration of the first III-N semiconductor layer, and a dislocation density at a surface of the second III-N semiconductor layer opposite the foreign substrate can be less than $2\times10^{9}$ $cm^{-2}$.

Methods and devices described herein can each include one or more of the following features. Injecting the hydrocarbon precursor can comprise injecting a hydrocarbon precursor having a chemical formula ($C_xH_y$), where x and y are integers greater than or equal to 1. Forming the III-N semiconductor layer on the substrate can comprise forming the III-N semiconductor layer as a III-N buffer layer over a III-N nucleation layer over a silicon substrate. Methods can comprise forming a III-N channel layer over the III-N buffer layer and forming a III-N barrier layer over the III-N channel layer, thereby forming a two-dimensional electron gas (2DEG) active channel adjacent to an interface between the channel layer and the barrier layer. Forming the III-N semiconductor layer as a III-N buffer layer can comprise forming the III-N buffer layer under a plurality of growth conditions, and forming the III-N channel layer can comprise forming the III-N channel layer under the same or substantially the same growth conditions. The plurality of growth conditions can comprise a surface temperature and a reactor pressure. The plurality of growth conditions can further comprise a ratio of group-III precursor flow rate to group-V precursor flow rate. Forming the III-N semiconductor layer on the substrate can comprise forming the III-N semiconductor layer by metal organic chemical vapor deposition (MOCVD). The barrier layer can comprise AlGaN, the channel layer can comprise undoped or unintentionally doped (UID) GaN, and the buffer layer can comprise AlGaN or GaN or both.

Forming the III-N semiconductor layer can comprise injecting a group-III precursor into the reactor at a group-III precursor molar flow rate, and injecting the hydrocarbon precursor into the reactor can comprise injecting the hydrocarbon precursor into the reactor at a hydrocarbon precursor molar flow rate, wherein the hydrocarbon precursor molar flow rate is at least 0.02 times the group-III precursor molar flow rate. Forming the III-N semiconductor layer can comprise injecting a group-III precursor into the reactor at a group-III precursor molar flow rate, and injecting the hydrocarbon precursor into the reactor can comprise injecting the hydrocarbon precursor into the reactor at a hydrocarbon precursor molar flow rate, wherein the hydrocarbon precursor molar flow rate is greater than the group-III precursor molar flow rate. The hydrocarbon precursor can comprise propane or methane or both. Methods can further comprise adding a gate terminal, a drain terminal, and a source terminal to the semiconductor device, thereby forming a III-N high electron mobility transistor (HEMT). Methods can further comprise adding an anode terminal and a cathode terminal to the semiconductor device, thereby forming a III-N diode. Causing the III-N semiconductor layer to be insulating or semi-insulating can comprise causing the III-N semiconductor layer to have a resistivity of at least $1\times10^5$ or $1\times10^7$ ohm-cm. Carbon doping the III-N semiconductor layer can result in the III-N semiconductor layer having a carbon concentration greater than $1\times10^{18}$ $cm^{-3}$. The hydrocarbon precursor can be injected into the reactor while forming the first III-N material layer but not while forming the second III-N material layer.

The III-N semiconductor layer can have a first side distal from the substrate and a second side between the first side and the substrate, wherein the dislocation density in the III-N semiconductor layer is a dislocation density adjacent to the first side of the III-N semiconductor layer. The III-N semiconductor layer can comprise a III-N buffer layer over a III-N nucleation layer, wherein the substrate is a silicon substrate. Devices can further comprise a III-N channel layer over the III-N buffer layer and a III-N barrier layer over the III-N channel layer, thereby forming a two-dimensional electron gas (2DEG) active channel adjacent to an interface between the channel layer and the barrier layer. The barrier layer can comprise AlGaN, the channel layer can comprise undoped or unintentionally doped (UID) GaN, and the buffer layer can comprise AlGaN or GaN or both. The substrate can be a foreign substrate. Devices can further comprise a gate terminal, a drain terminal, and a source terminal, wherein the semiconductor device is a III-N high electron mobility transistor (HEMT). Devices can further comprise an anode terminal and a cathode terminal, wherein the semiconductor device is a III-N diode. The carbon doping density in the III-N semiconductor layer can be less than $5\times10^{21}$ $cm^{-3}$.

A surface of the second III-N material layer that is opposite the substrate can have a density of macroscopic features which is less than 5 features/$cm^2$, wherein each of the macroscopic features has an average height of greater than 100 nanometers. A combined thickness of the first III-N semiconductor layer and the second III-N semiconductor layer can be less than 6 microns, for example less than 5 microns, less than 4 microns, or less than 3 microns. The second III-N material layer can be thinner than the first III-N material layer.

Particular embodiments of the subject matter described in this specification can be implemented so as to realize one or more of the following advantages. An insulating or semi-insulating carbon doped III-N layer can be formed with a level of carbon doping from a wide range of concentrations (1e16-1e22 $cm^{-3}$) with fewer restrictions on one or more growth parameters of the layer compared to conventional technology. Insulating or semi-insulating layers can be formed with low dislocation densities and smooth surfaces grown on foreign substrates, e.g., Si or SiC substrates. Injecting a halogen free precursor (e.g., a hydrocarbon precursor) during metalorganic chemical vapor deposition (MOCVD) can reduce or eliminate interactions of halogen containing molecules with the metalorganic precursors, thereby avoiding the influence of $CX_4$ (X=halogen) precursors on an alloy composition (i.e., the ratio of Al to Ga in AlGaN) during MOCVD growth of carbon doped AlGaN.

DESCRIPTION OF DRAWINGS

Like reference symbols in the various drawings indicate like elements.

DETAILED DESCRIPTION

Figure 1A:
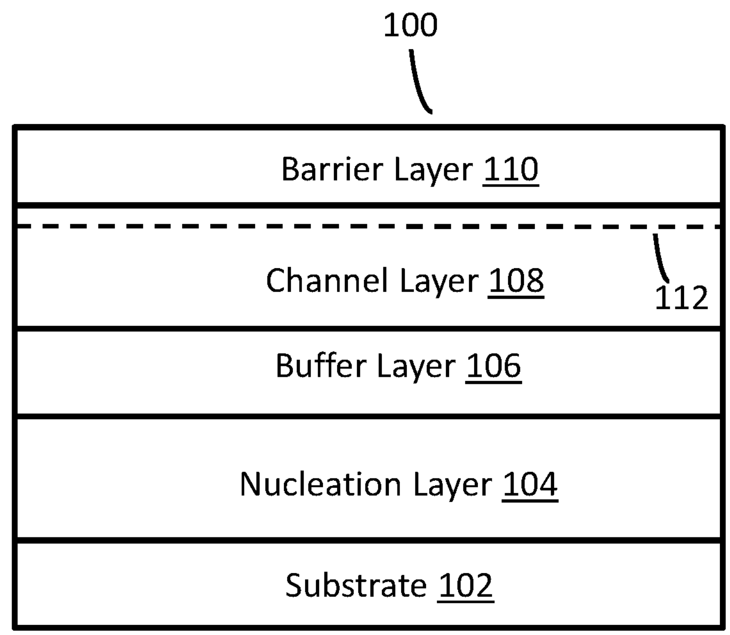
FIGS. 1A and 1B are cross-sectional views of an example of III-N semiconductor device.
Figure 1B:
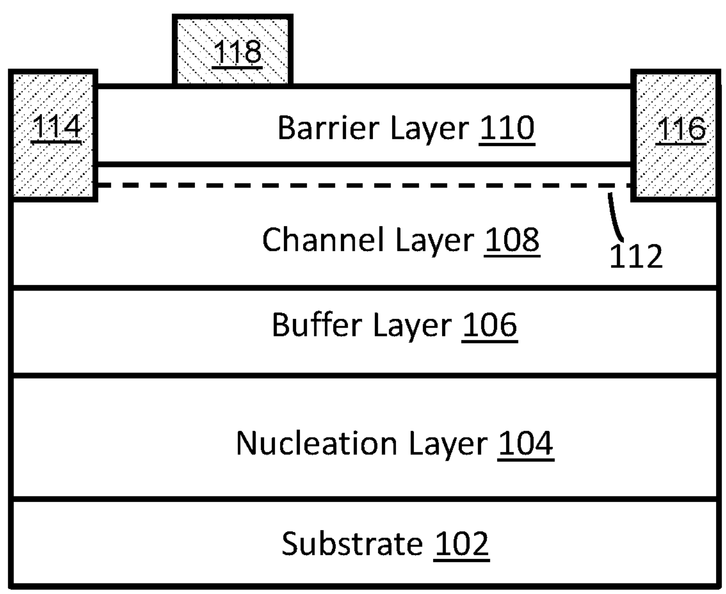

FIG. 1A is a cross-sectional view of an example III-Nitride (i.e., III-N) semiconductor device 100. For example, the device can be a transistor, e.g., a III-N high electron mobility transistor (HEMT), by adding source 114, drain 116, and gate 118 terminals to the device, as illustrated in FIG. 1B. In another example, the device can be a diode by adding anode and cathode terminals to the device (not shown).

The device includes a substrate 102. The substrate can be, e.g., silicon, SiC, aluminum nitride (AlN), GaN, sapphire ($Al_2O_3$), or any other suitable growth substrate for the growth of III-N materials. Because large native substrates (i.e., substrates formed of III-N materials) are currently unavailable and tend to be very expensive, the device is typically formed on a foreign substrate (i.e., a substrate formed of a material that is not a III-N material), such as silicon, silicon carbide, or sapphire. The device includes a nucleation layer 104 on the substrate. The nucleation layer can be a III-N nucleation layer and can include, e.g., AlN.

The device includes a buffer layer 106. The buffer layer can be a III-N buffer layer and can include, e.g., C-doped AlGaN or GaN or both. The buffer layer can include several different layers, e.g., with some layers closer to the substrate having a higher concentration of Al and some layers further from the substrate having a lower concentration of Al. The buffer layer can be made insulating or semi-insulating by carbon doping the buffer layer. This can be useful, e.g., to prevent subsurface leakage or premature breakdown.

The device includes a III-N channel layer 108 and a III-N barrier layer 110, where the compositions of the channel layer and the barrier layer are selected to induce a two-dimensional electron gas (2DEG) 112 active channel adjacent to an interface between the channel layer and the barrier layer. For example, the channel layer can include undoped or unintentionally doped (UID) GaN and the barrier layer can include AlGaN.

The terms III-Nitride or III-N materials, layers, devices, and structures can refer to a material, device, or structure comprised of a compound semiconductor material according to the stoichiometric formula $B_wAl_xIn_yGa_zN$, where w+x+y+z is about 1, and w, x, y, and z are each greater than or equal to zero and less than or equal to 1. In a III-Nitride or III-N device, the conductive channel can be partially or entirely contained within a III-N material layer.

The layers of the device can be formed by molecular beam epitaxy (MBE) or metalorganic chemical vapor deposition (MOCVD) in a reactor or other techniques. One way to achieve carbon doping in a III-N layer formed by MOCVD with $NH_3$ as the nitrogen precursor is to adjust the layer growth conditions so that carbon from metalorganic precursors (e.g., TMGa or TMAl or both) is incorporated into the layers. For example, some growth conditions that favor the incorporation of carbon include: low reactor pressure, low $NH_3$ partial pressure, low deposition temperatures, and high growth rates.

When these growth conditions are implemented for carbon doping at levels sufficient to cause a layer to be insulating or semi-insulating for certain applications, the growth conditions are limited for calibration with respect to other features of the layer, e.g., threading dislocation density and surface roughness of the layer. For example, consider a layer formed on a foreign (i.e., non-III-N) substrate, e.g., silicon (Si), silicon carbide (SiC), or sapphire ($Al_2O_3$).

Such a layer can be formed under growth conditions including one or more of lower reactor pressure, lower $NH_3$ partial pressure, lower deposition temperatures, and higher growth rates, but these growth conditions can also result in higher dislocation densities and higher levels of point defects in the layer. Increasing carbon doping levels to greater than about $5\times10^{18}$ $cm^{-3}$ (and in some cases greater than $8\times10'^{17}$ $cm^{-3}$) using these methods can additionally result in surface roughening or poor surface morphology or both.

Another way to achieve carbon doping in a layer is to inject a hydrocarbon precursor into the reactor during growth of the layer. Hydrocarbon precursors include molecules of the chemical composition ($C_xH_y$), where x and y are integers greater than or equal to 1. Examples of hydrocarbons include propane ($C_3H_8$), methane ($CH_4$), and $C_2H_2$.

This way of achieving carbon doping can result in the layer having carbon doping in excess of $1\times10^{18}$, $5\times10^{18}$, $1\times10^{19}$, or $3\times10^{19}$ $cm^{-3}$ while simultaneously having a dislocation density less than $2\times10^{9}$ $cm^{-2}$, for example about $1\times10^{9}$ $cm^{-2}$ or less or about $8\times10^{8}$ $cm^{-2}$ or less. The carbon doping density in the III-N semiconductor layer can be between $1\times10^{19}$ $cm^{-3}$ and $5\times10^{21}$ $cm^{-3}$, or between $1\times10^{18}$ $cm^{-3}$ and $5\times10^{21}$ $cm^{-3}$. In some implementations, the nucleation layer is between 20-50 nm thick, the buffer layer is between 1-10 microns thick (e.g., about 5 microns), the channel layer is about 200-1000 nm thick (typically about 400 nm), and the barrier layer is between 10-40 nm thick (e.g., about 25 nm).

Figure 2:
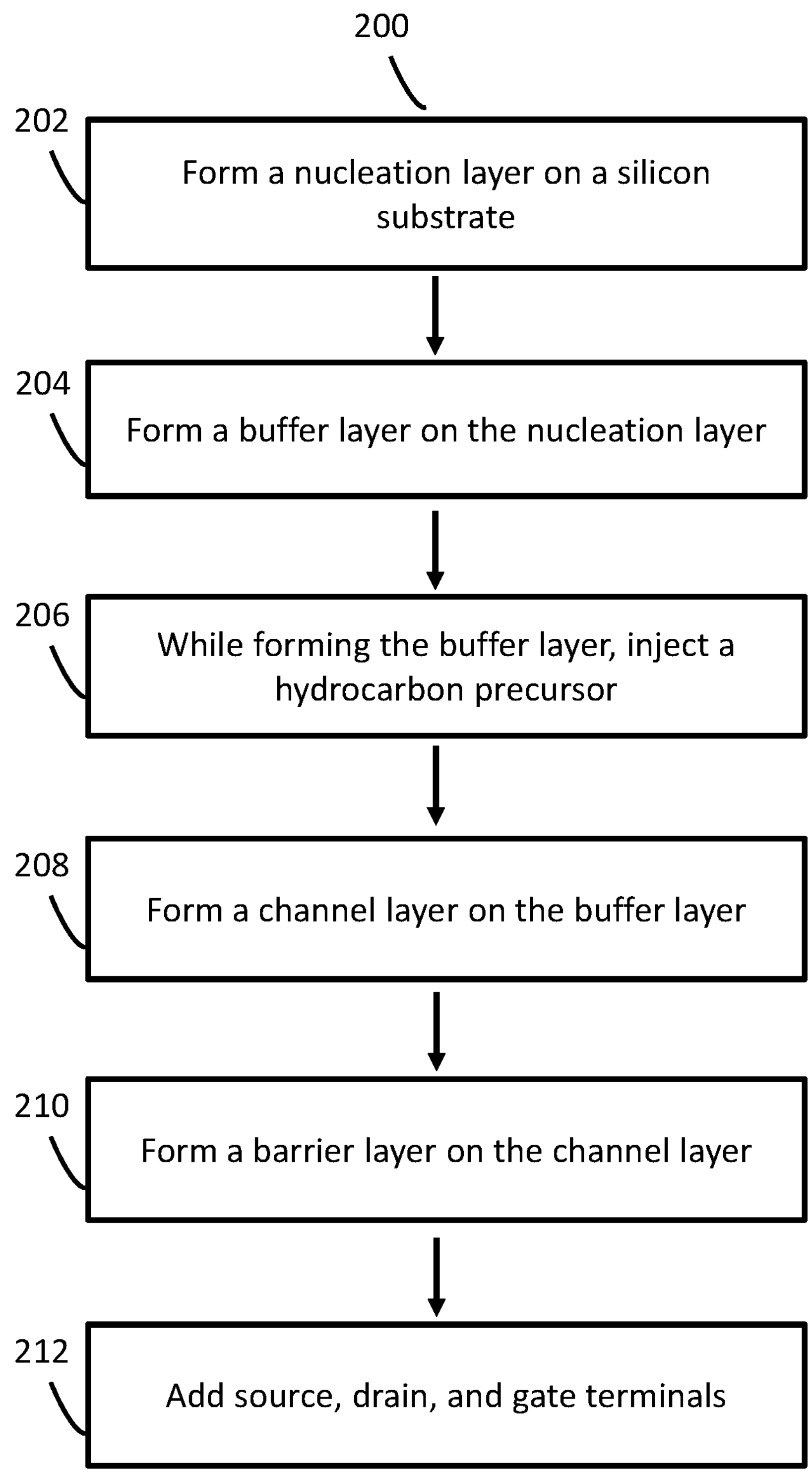
FIG. 2 is a flow diagram of an example method for fabricating a III-N semiconductor device including a carbon doped layer.

FIG. 2 is a flow diagram of an example method 200 for fabricating a III-N semiconductor device including a carbon doped layer. For purposes of illustration, the method will be described with reference to the example device 100 of FIG. 1, but the method can be used to fabricate other devices and to carbon dope other types of layers in other devices.

A nucleation layer is formed on a silicon substrate (202). For example, the silicon substrate can be placed into a reactor such as an MOCVD reactor, and the nucleation layer can be deposited, e.g., as a layer of AlN within the reactor.

A buffer layer is formed on the nucleation layer (204). For example, the buffer layer can be deposited, e.g., as a layer of AlGaN or GaN or both. In some implementations, the buffer layer comprises more than one layer. Layers of AlGaN are deposited, with a decreasing amount of Al in each successive layer. Eventually, one or more layers of GaN can be deposited.

While the buffer layer is formed, a hydrocarbon precursor is injected into the reactor (206). For example, the hydrocarbon precursor can be injected into the reactor simultaneously or alternately while injecting group III and/or group V precursors into the reactor.

A channel layer is formed on the buffer layer (208). For example, the channel layer can be deposited, e.g., as a layer of undoped or unintentionally doped (UID) GaN. In some implementations, the channel layer is formed under the same or substantially the same growth conditions as the buffer layer. Where the buffer layer includes a top level layer of GaN, the channel layer can be deposited by ceasing to inject the hydrocarbon precursor and continuing to deposit GaN without altering any other growth conditions in the reactor. That is, the reactor pressure and/or temperature and/or the total gas molar flow rate into the reactor and/or the ratio of group V precursor molar flow rate to group III precursor molar flow rate can be the same for the channel layer and for the portion of the buffer layer that is directly adjacent to the channel layer, with a hydrocarbon precursor injected into the reactor during growth of the portion of the buffer layer that is directly adjacent to the channel layer but not during growth of the channel layer.

A barrier layer is formed on the channel layer (210). For example, the barrier layer can be deposited, e.g., as a layer of AlGaN. A two-dimensional electron gas (2DEG) active channel is induced adjacent to an interface between the channel layer and the barrier layer. The barrier layer can have a larger bandgap than the channel layer, which can in turn at least partially cause the 2DEG to be induced in the channel layer. To form a transistor, source, gate, and drain terminals are then formed on the III-N material layer structure (212). Alternatively, to form a diode, anode and cathode terminals are then formed on the III-N material layer structure (not shown).

Figure 3:
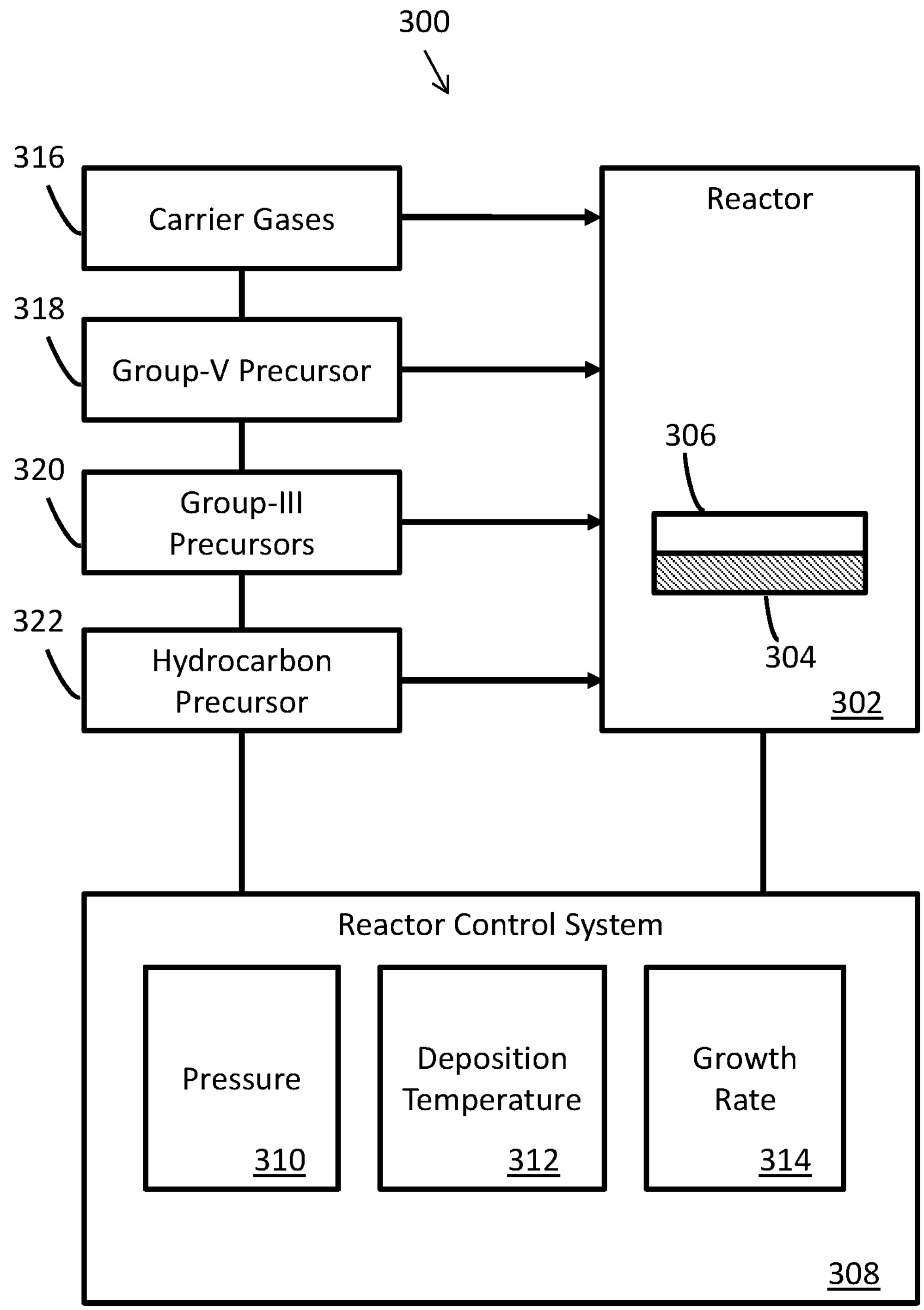
FIG. 3 is a block diagram of a system for fabricating a III-N semiconductor device with at least one layer that is carbon doped.

FIG. 3 is a block diagram of a system 300 for fabricating a III-N semiconductor device with at least one layer that is carbon doped. The system can be used, for example, to perform the method of FIG. 2 to fabricate the devices of FIGS. 1A and 1B.

The system includes a reactor 302, e.g., an MOCVD reactor. A substrate 304 is placed into the reactor and a III-N layer 306 is formed on the substrate. A reactor control system 308 controls the formation of the layer 306 by adjusting one or more growth conditions. The reactor control system can control the injection of one or more materials into the reactor, including carrier gases 316 (e.g., an inert carrier gas such as $H_2$ or $N_2$ or both), group-V precursor gases 318 (e.g., $NH_3$), group-III precursor gases 320 (e.g., TMGa or TMAl or both), and hydrocarbon precursor gases 322 (e.g., one or more of $C_3H_8$, $CH_4$, and $C_2H_2$).

The reactor control system can be implemented, e.g., as a system of one or more computers that receives input from an operator and provides output control signals, e.g., to the reactor and storage modules for the gases. The reactor control system can include a pressure control module 310 (e.g., to control the pressure in the reactor), a deposition temperature control module 312 (e.g., to control the surface temperature of a layer being formed), a growth rate module 314, and other modules, for example. The growth rate module 314 may control the growth rate indirectly by controlling variables which affect the growth rate, such as reactor pressure, surface temperature, and flow rates of the various precursors and carrier gases.

In some implementations, the reactor control system is configured to form the III-N semiconductor layer by injecting a group-III precursor into the reactor at a group-III precursor molar flow rate and by injecting the hydrocarbon precursor into the reactor at a hydrocarbon precursor molar flow rate. The amount of carbon doping in the layer can be at least partially controlled by varying the ratio between the hydrocarbon precursor molar rate and the group-III precursor molar flow rate.

It has been found that for some hydrocarbon precursors for carbon doping of III-N materials during MOCVD growth of the III-N materials, in particular propane ($C_3H_8$), the dopant incorporation efficiency is much lower than the incorporation efficiency of other dopants typically introduced during MOCVD growth of III-N materials. For example, for a dopant such as silicon, where silane or disilane is used as the silicon precursor, when the ratio of the silicon precursor molar flow rate to the group-III precursor molar flow rate is about 1/1000 (and in some cases even lower), the silicon doping level in the III-N material is approximately equal to the saturation limit of the dopant in the III-N material, which may be around $1\times10^{21}$ $cm^{-3}$. Increasing the silicon precursor molar flow rate relative to the group-III precursor molar flow rate to a higher value does not substantially increase the concentration of electrically active silicon in the layer, and typically results in a poorer structural quality of the resulting III-N layer, for example leading to higher dislocation and point defect densities, as well as poor surface morphology. However, for carbon doping of III-N materials during MOCVD growth using propane as the carbon precursor, when the growth is performed under reactor conditions that correspond to low carbon doping levels (e.g., less than $1\times10^{17}$ $cm^{-3}$) in the absence of the propane precursor, adding propane at a molar flow rate of about 1/1000 that of the group-III precursor molar flow rate does not substantially increase the carbon doping in the III-N material, and typically still yields a carbon doping level which is less than $1\times10^{17}$ $cm^{-3}$.

In some systems, and in particular when propane ($C_3H_8$) is utilized as the hydrocarbon precursor, a hydrocarbon precursor molar flow rate which is about or at least 0.02 times the group-III precursor molar flow rate may be needed in order for the carbon doping level in the layer to be between about $1\times10^{17}$ and $1\times10^{19}$ $cm^{-3}$, or to be in excess of $1\times10^{17}$ $cm^{-3}$. In some systems, when the hydrocarbon precursor molar flow rate is about or at least 0.2 times the group-III precursor molar flow rate, the carbon doping level in the layer can be about or in excess of $1\times10^{18}$ $cm^{-3}$, or between about $1\times10^{18}$ and $1\times10^{20}$ $cm^{-3}$. In some systems, when the hydrocarbon precursor molar flow rate is substantially greater than the group-III precursor molar flow rate, e.g., 2 times or 20 times or 200 times or 2000 times or 20,000 times the group-III precursor molar flow rate, the carbon doping level in the layer can be about or in excess of $1\times10^{18}$ or $1\times10^{19}$ or $1\times10^{20}$ $cm^{-3}$. The resistivity of a carbon doped layer formed with propane precursors can be greater than $1\times10^{5}$ ohm-cm for carbon doping levels of about 1e18 $cm^{-3}$ or larger, or greater than $1\times10^{7}$ ohm-cm for carbon doping levels of about $1\times10^{19}$ $cm^{-3}$ or larger, or greater than $1\times10^{8}$ ohm-cm for carbon doping levels of about $1\times10^{20}$ $cm^{-3}$ or larger.

In some implementations, the reactor control system is configured to form at least one layer (e.g., the UID GaN channel layer) at a surface temperature of 1077 C and a pressure of 200 mBarr. The reactor control system flows the nitrogen precursor, e.g., ammonia ($NH_3$), into the reactor at a rate of 0.54 mol/min, flows tri-methyl gallium (TMGa) into the reactor at a rate of 0.65 milli-mol/min, and controls the total gas flow into the reactor to at or about 80 liters per minute. The reactor control system can maintain the total gas flow at a substantially constant rate by increasing or decreasing the carrier gas flow to compensate for increases or decreases in other flows. This results in carbon doping of about $5\times10'^{6}$ $cm^{-3}$ or lower in this layer.

The reactor control system can form the carbon doped layer under the same or substantially the same growth conditions by flowing the hydrocarbon precursor into the reactor. For example, for the carbon doped layer, if the surface temperature is maintained at 1077 C, the pressure is maintained at 200 mBarr, the ammonia flow rate is maintained at 0.54 mol/min, the TMGa flow rate is maintained at 0.65 milli-mol/min, and the rate of total gas flow into the reactor is maintained at about 80 liters per minute, by flowing a hydrocarbon precursor into the reactor, carbon doping levels of greater than $1\times10^{18}$ $cm^{-3}$, greater than $5\times10^{18}$ $cm^{-3}$, greater than $1\times10^{19}$ $cm^{-3}$, or greater than $1\times10^{20}$ $cm^{-3}$ can be achieved. At the same time, if the carbon doped III-N layer is formed on a foreign substrate such as silicon, the dislocation density of the upper portion of the carbon doped III-N layer (i.e., the portion adjacent to the surface of the carbon doped III-N layer which is furthest from the substrate) can be maintained at a level smaller than $2\times10^{9}$ $cm^{-2}$, and typically even smaller than $1\times10^{9}$ $cm^{-2}$, even if the total thickness of the III-N layers in the structure is less than 6 microns, less than 5 microns, less than 4 microns, or less than 3 microns.

By way of comparison, if the hydrocarbon precursor is not flowed into the reactor during growth of the carbon doped layer, the reactor control system can adjust one or more or all of the growth parameters to incorporate enough carbon to cause the carbon doped layer to become insulating to a specified degree. For example, the reactor control system can reduce the pressure to 50 mBarr, reduce the temperature to 1020 C, reduce the $NH_3$ flow rate to 0.045 mol/min, maintain the total gas flow at about 80 liters per minute, and maintain the flow of group-III precursor gases.

These adjustments to the growth conditions can result in carbon doping of up to about $5\times10^{18}$ $cm^{-3}$. The dislocation density at the upper surface of the layer when the layers are grown under these conditions can be greater than $2\times10^{9}$ $cm^{-2}$, and is typically between $5\times10^{9}$ and $6\times10^{9}$ $cm^{-2}$. Further adjusting the reactor conditions to further increase the carbon concentration in these layers can cause substantial degradation in the surface morphology of the material structure, and typically also results in even higher dislocation densities.

Figure 4:
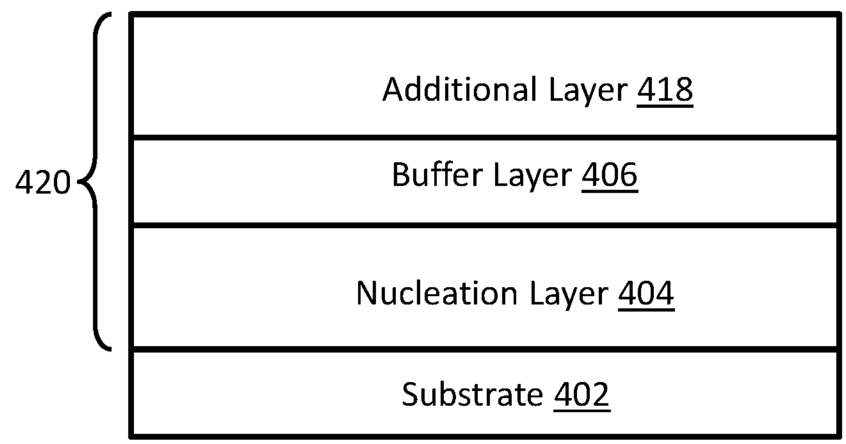
FIG. 4 is a cross-sectional view of an example III-N semiconductor material structure.

Referring now to FIG. 4, in many III-N semiconductor devices, the active portion of the device is contained within the layer 418 of the III-N material structure 420 which is furthest from the substrate 402. For example, referring to the transistor structure of FIGS. 1A and 1B, the device channel 112 is contained within the channel layer 108 (thus the channel layer 108 and barrier layer 110 of FIGS. 1A and 1B correspond to the additional layer 418 of FIG. 4). In such devices, it is often preferable to electrically isolate the substrate 402 and/or nucleation layer 404 and/or buffer layer 406 from the additional layer 418, while forming the additional layer 418 under conditions that result in minimal defects and/or traps in the additional layer 418. As previously described, this can be achieved by injecting a hydrocarbon precursor into the reactor during growth of the nucleation and/or buffer layers 404 and 406, respectively, in order to dope these layers with carbon and render them insulating or semi-insulating, while growing some or all of the additional layer 418 as an undoped (or unintentionally doped) layer, with substantially lower levels of carbon. In many cases, the thickness of the buffer layer 406 is greater than that of the additional layer 418, such that at least half of the thickness of the III-N material structure has a substantial carbon doping. Such a structure can result in a reduced dislocation density at the surface of the additional layer 418, as well as causing the upper surface of the III-N material structure 420 to be substantially smoother, as compared to the case where the carbon doping of the nucleation and/or buffer layers is achieved by other methods.

These improved characteristics result in improved device performance and higher yields.

For example, when the carbon doping is achieved by other methods that were previously described, such as reducing the reactor pressure and temperature during growth of the carbon doped layers, the resultant III-N films grown on foreign substrates (such as Silicon substrates) have been found to have large macroscopic features on the surface. While these features tend to have a fair amount of spatial separation between them, devices formed directly on these features are either inoperable or perform substantially worse than other devices on the wafer.

Figure 5A:
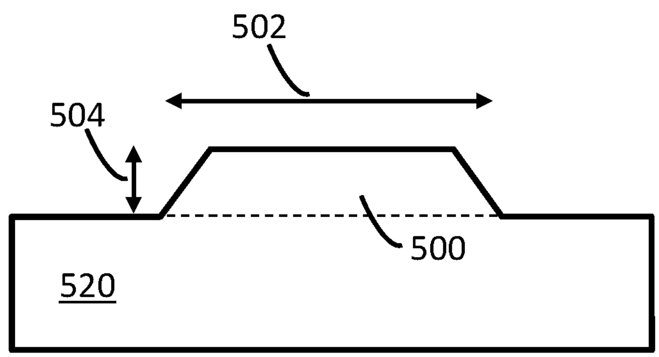
FIGS. 5A and 5B are cross-sectional and plan view schematic diagrams, respectively, of a macroscopic feature formed on the surface of a III-N material structure.
Figure 5B:
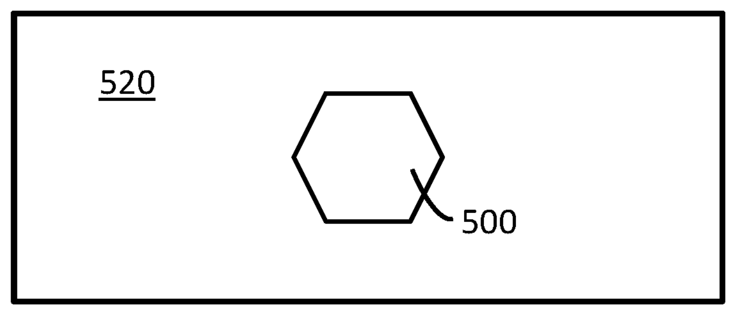

A schematic diagram of a macroscopic feature 500 formed on the surface of a III-N material structure 520 grown under conditions that result in a higher density of such features is shown in FIGS. 5A and 5B. FIG. 5A is a cross-sectional view of the feature 500, and FIG. 5B is a plan view (top view) of the feature 500. As seen in the plan view of FIG. 5B, the feature 500 can have a hexagonal shape. The average diameter 502 of the features is typically greater than 20 microns, and more specifically in the range of about 20-500 microns, and the average height 504 of the feature is typically greater than 100 nanometers, for example about 200-500 nanometers. For comparison, in the regions of the wafer that do not include these macroscopic features, the average deviation in surface height is typically much less than 20 nanometers.

Referring again to FIG. 4, it has been found that when the nucleation and/or buffer layers 404 and 406, respectively, have a carbon doping density greater than $1\times10^{18}$ cm$^{-3}$, when the carbon doping is achieved by adjusting the reactor conditions, for example by lowering the surface temperature and reactor pressure in order to incorporate higher concentrations of carbon into the III-N layers, the surface of the III-N material structure 420 has a density of macroscopic features 500 which is greater than 8 features/cm$^2$. On the other hand, when the carbon doping is achieved by injecting a hydrocarbon precursor such as propane during growth of the layers 404 and/or 406, the density of macroscopic features 500 can be made to be less than 5 features/cm$^2$, and is typically less than 2 features/cm$^2$.

A number of implementations have been described. Nevertheless, it will be understood that various modifications may be made without departing from the spirit and scope of the techniques and devices described herein. For example, the processes described herein for forming carbon doped III-N layers can be used in the fabrication of other devices that require insulating or semi-insulating layers, e.g., photovoltaic cells, lasers, and LEDs. Accordingly, other implementations are within the scope of the following claims.

What is claimed is:

1. A material structure, comprising:

a first III-N semiconductor layer on a silicon substrate; and a second III-N semiconductor layer on a side of the first III-N semiconductor layer opposite the silicon substrate, the second III-N semiconductor layer being thinner than the first III-N semiconductor layer;

wherein the first III-N semiconductor layer comprises an AlN nucleation layer directly on the silicon substrate and a III-N buffer layer disposed between the AlN nucleation layer and the second III-N semiconductor layer, such that the III-N buffer layer has a carbon concentration that is greater than $1\times10^{18}$ cm$^{-3}$ throughout the layer, and the carbon concentration of the III-N buffer layer is greater than the carbon concentration of the AlN nucleation layer;

wherein a carbon concentration throughout the second III-N semiconductor layer is less than the carbon concentration throughout the III-N buffer layer;

wherein a surface of the second III-N semiconductor layer that is opposite the silicon substrate has a density of macroscopic features which is less than 5 features/cm$^2$, wherein each of the macroscopic features has an average height of greater than 100 nanometers; and wherein a dislocation density at a surface of the second III-N semiconductor layer opposite the silicon substrate is less than $2\times10^9$ cm$^{-2}$.

2. The material structure of claim 1, the second III-N semiconductor layer comprising a III-N barrier layer and a III-N channel layer, wherein a two-dimensional electron gas (2DEG) channel is adjacent to an interface between the III-N channel layer and the III-N barrier layer.

3. The material structure of claim 2, wherein the III-N barrier layer comprises AlGaN, and the III-N channel layer comprises undoped or unintentionally doped (UID) GaN.

4. The material structure of claim 1, wherein a combined thickness of the first III-N semiconductor layer and the second III-N semiconductor layer is less than 6 microns.

5. A semiconductor device comprising the material structure of claim 1.

6. The semiconductor device of claim 5, further comprising a gate terminal, a drain terminal, and a source terminal, wherein the semiconductor device is a III-N high electron mobility transistor (HEMT).

* * * * *